United States Patent
Lin et al.

(10) Patent No.: US 6,670,551 B2
(45) Date of Patent: Dec. 30, 2003

(54) IMAGE SENSING COMPONENT PACKAGE AND MANUFACTURE METHOD THEREOF

(75) Inventors: Wen-Hsin Lin, Taipei (TW); Fa-Tai Wang, Taipei (TW)

(73) Assignee: Amkor Technology, Inc., Chandler, AZ (US)

( * ) Notice: Subject to any disclaimer, the term of this patent is extended or adjusted under 35 U.S.C. 154(b) by 11 days.

(21) Appl. No.: 09/871,993

(22) Filed: Jun. 4, 2001

(65) Prior Publication Data

US 2002/0048842 A1 Apr. 25, 2002

(30) Foreign Application Priority Data

Oct. 5, 2000 (TW) ........................................ 89120832 A

(51) Int. Cl.[7] ................................................. H05K 5/06
(52) U.S. Cl. ..................................... 174/52.3; 174/52.4
(58) Field of Search ........................... 174/52.1–52.4; 438/48, 126

(56) References Cited

U.S. PATENT DOCUMENTS

| | | | | |
|---|---|---|---|---|
| 3,543,106 A | * | 11/1970 | Kern ............................ | 257/723 |
| 3,648,131 A | * | 3/1972 | Stuby ...................... | 317/235 R |
| 3,768,157 A | * | 10/1973 | Buie ........................... | 174/52.4 |
| 4,670,770 A | * | 6/1987 | Tai ............................... | 357/60 |
| 4,833,102 A | * | 5/1989 | Byrne et al. .............. | 174/50.51 |
| 4,949,148 A | * | 8/1990 | Bartelink ..................... | 357/74 |
| 4,954,875 A | * | 9/1990 | Clements ..................... | 357/75 |
| 4,990,719 A | * | 2/1991 | Wright ...................... | 174/52.4 |
| 5,019,943 A | * | 5/1991 | Fassbender et al. ......... | 361/396 |
| 5,087,694 A | * | 2/1992 | Dumas et al. ........... | 106/150.1 |
| 5,753,959 A | * | 5/1998 | Quinn et al. ................ | 257/443 |
| 5,756,380 A | * | 5/1998 | Berg et al. .................. | 438/125 |
| 5,804,004 A | * | 9/1998 | Tuckerman et al. ........... | 156/60 |
| 5,814,885 A | * | 9/1998 | Pogge et al. ................ | 257/730 |
| 6,215,193 B1 | * | 4/2001 | Tao et al. .................... | 257/777 |
| 6,252,302 B1 | * | 6/2001 | Farnworth ................... | 257/723 |
| 6,268,231 B1 | * | 7/2001 | Wetzel ........................ | 438/116 |
| 6,271,598 B1 | * | 8/2001 | Vindasius et al. ........... | 257/777 |
| 6,300,162 B1 | * | 10/2001 | Shiel et al. ................. | 438/106 |
| 6,329,715 B1 | * | 12/2001 | Hayashi ...................... | 257/724 |
| 6,428,650 B1 | * | 8/2002 | Chung ......................... | 156/250 |

* cited by examiner

*Primary Examiner*—David L. Talbott
*Assistant Examiner*—Tuan Dinh
(74) *Attorney, Agent, or Firm*—Gunnison, McKay & Hodgson, L.L.P.; Serge J. Hodgson

(57) ABSTRACT

The present invention discloses an image sensing semiconductor package and manufacture method thereof utilizing the plastic leaded chip carrier (PLCC) manufacture process to produce image sensing chips with a cheaper plastic carrier, and it also seals dry high-pressure gas inside the image sensing chip in the manufacture process. Therefore, when the image sensing chip is used in a device, it can prevent moisture in the air from entering into the interior of the image sensing component due to pressure difference that will shorten the lifespan of the image sensing chip. The invention also provides a component rinsing procedure for the image sensing semiconductor package manufacture process, so that no environmental factor of the manufacture process such as humidity and dust particles will affect the sensitivity of the chip or the normal display of the screen, and hence lower the defective rate of the product.

8 Claims, 6 Drawing Sheets

IMAGE SENSING COMPONENT PACKAGE AND MANUFACTURE METHOD THEREOF

BACKGROUND OF THE INVENTION

1. Field of the Invention

The present invention relates to an image sensing component package and manufacture method thereof, more particularly to a complimentary metallic oxide semiconductor (CMOS) image sensing chip package and its manufacture method.

2. Description of the Related Art

The semiconductor packaging technology, more particularly the chip packaging process is a common and well-known art in the semiconductor industry. In light of the requirements for different chip features, the packaging process will change accordingly. For instance, the commonly used optical image capture device of the optical drive, digital camera, or scanner needs to protect the photo sensing surface of its CMOS image sensing chip by a transparent material (such as glass) and makes the video signals receivable.

Please refer to FIG. 1, which shows a three-dimensional diagram of an image sensing chip, and generally the image sensing chip 10 is a complimentary metallic oxide semiconductor (CMOS) comprising: a glass plate 11, a carrier 12, and a printed circuit board 13; wherein a semiconductor being fixed in the middle of the printed circuit board 13 and having a plurality of conductive pads disposed on its external sides for receiving image signals through the glass plate 11. Please refer to FIG. 2 for the description of the structure of the image sensing chip 10. The printed circuit board 13 is composed of a semiconductor 131, a conductive wire 132, and a substrate 133. The printed circuit board 13 is adhered onto the carrier 12, and then the glass plate 11 is mounted onto the carrier 12 to finish with the manufacture of the image sensing chip. The conventional image sensing chip generally utilizes the ceramic leaded chip carrier (CLCC) process for the manufacture, i.e. using ceramic carrier 12 as the package material for the process. Ceramic that has the characteristics of high hardness, thermal resistance, stability, and inactiveness is a very suitable material to be used for making the carrier. However, its source mainly comes from foreign suppliers that leads a high price, and in turn causes the total manufacture cost to increase in a large fold. Furthermore, during the manufacturing of the image sensing chip, the pressure of its interior must be greater than the atmospheric pressure. Therefore, when the image sensing chip being installed onto a device for use, the moisture of the air will enter into the image sensing component due to the change of pressure, and the water vapor will permeate the image sensing chip easily and hence shorten the lifespan of the chip. Therefore, it is necessary to keep the internal pressure larger than the atmospheric pressure during the chip manufacturing.

Additionally, during the manufacturing process of the image sensing chip, the largest problem resides at the incapability of controlling the moisture and dust particles, which impact the chip's sensitivity, affect the quality of the normal received image, and lower the yield rate of the product.

Therefore, it is an object of the present invention to provide an apparatus for extending the range of operation of existing infrared remote controls. The primary objective of this invention is to provide an image sensing component package structure of which incorporates the PLCC process and utilizes cheaper plastic carrier to produce image sensing chips in order to reduce cost.

Another objective of this invention is to provide an image sensing component package process in which dry high-pressure gas is sealed into the interior of the image sensing chip to keep the internal pressure larger than the atmospheric pressure. Therefore, when the image sensing chip is used in a device, the moisture in the air will not enter into the image sensing component due to the pressure change, and therefore will not shorten the lifespan of the image sensing chip.

A further objective of the present invention is to provide an image sensing component package process in which a plurality of different components being disposed into a specially designed engineering plastic tray, and such engineering plastic tray is made of a material that can stand high temperature (300° C. to 600° C.), and also is wear proof. Therefore, different components can be put into the same tray to be processed and the present invention provides a practical mass-production method.

Another further objective of the present invention is to provide an image sensing packaged component process, wherein each component has gone through the rinsing process separately before proceeding with the adhesion. Therefore, it will not lower the yield rate of the product due to environmental factors such as moisture and dust particles.

In view of the problems of the traditional image sensing chip structure and its manufacture, the present invention makes use of a cheap plastic carrier to substitute the expensive ceramic carrier, and works with a feasible independent component rinsing process for the mass production of such product.

The present invention further provides an image sensing chip having a high-pressure gas in the package in order to enhance the lifespan of the image sensing chip.

Other features, advantages and embodiments of the invention will be apparent to those skilled in the art from the following description, accompanying drawings and appended claims.

BRIEF DESCRIPTION OF DRAWINGS

The above, as well as other advantages of the present invention, will become readily apparent to those skilled in the art from the following detailed description of a preferred embodiment when considered in the light of the accompanying drawings in which.

DETAILED DESCRIPTION OF THE INVENTION

Figure 1:
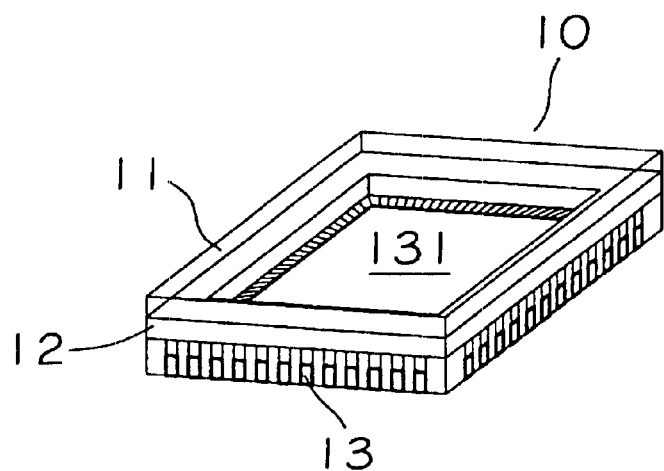
FIG. 1 is a perspective view of an image sensing chip.
Figure 2:
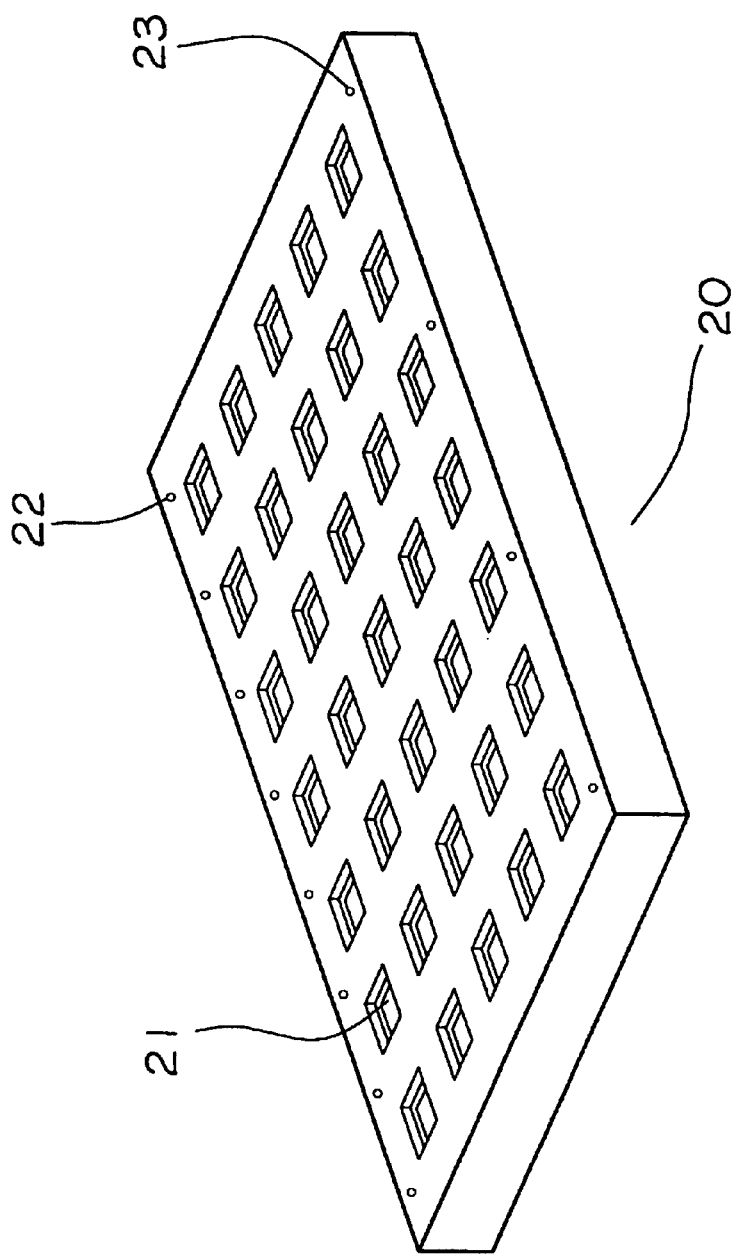
FIG. 2 shows the layer structure of the image sensing chip as illustrated in FIG. 1.
Figure 3:
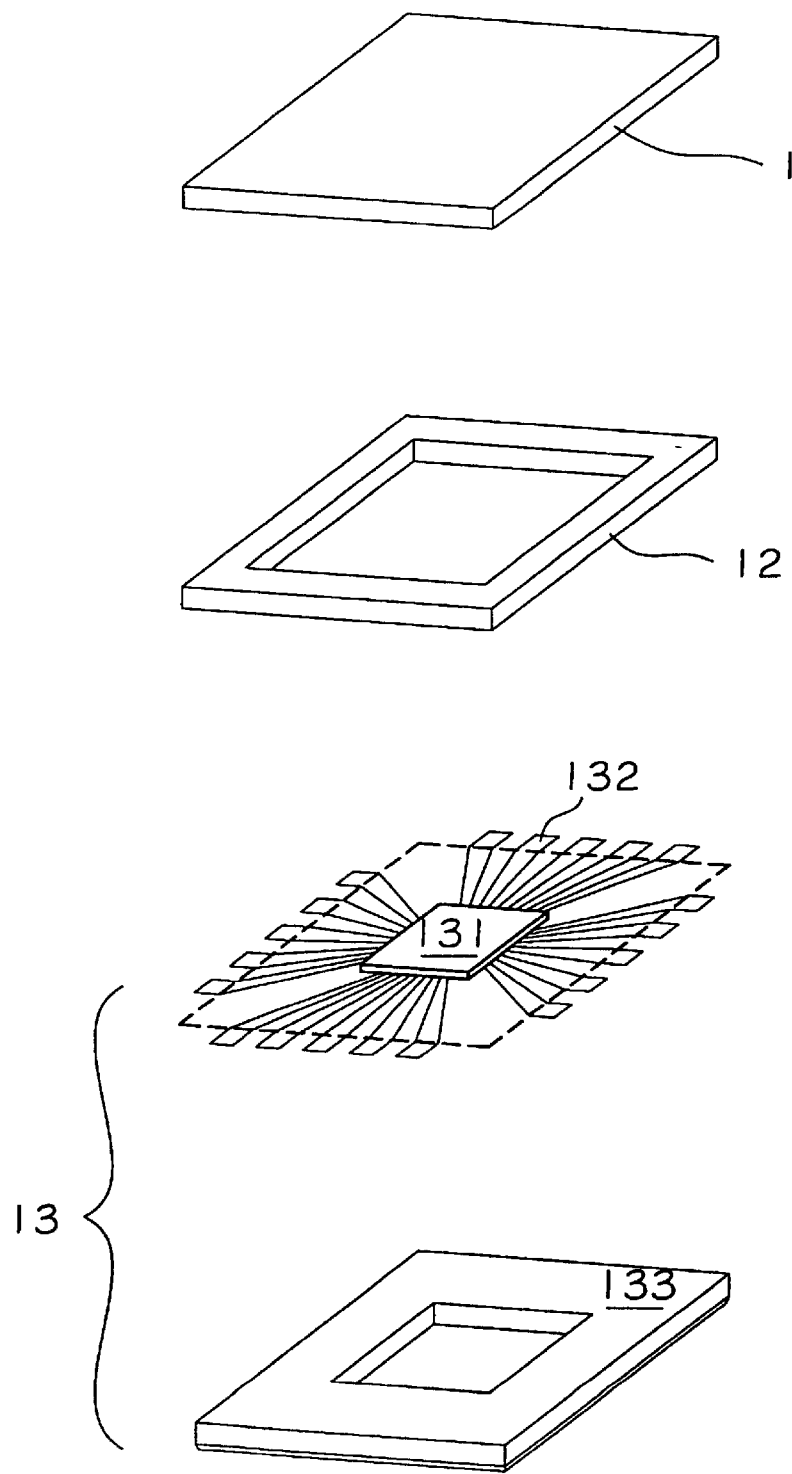
FIG. 3 is a perspective view of the tray for holding the carrier components used in the manufacturing process according to the present invention.

In FIG. 1, an image sensing chip 10 is generally a complimentary metallic oxide semiconductor (CMOS) used in the optical image capture devices such as optical disk drives, digital cameras, or scanners, comprising a glass plate 11, a carrier 12, and a printed circuit board 13, wherein a semiconductor 131 is fixed in the middle of the printed circuit board 13 and has a plurality of conductive pads being formed on the external edge of the semiconductor 131 for receiving video signals through the glass plate 11. FIG. 2 illustrates the layer structure of the image sensing chip 10 as illustrated in FIG. 1, wherein the printed circuit board 13 further comprises a semiconductor 131, a conductive wire 132, and a substrate 133, as illustrated in FIG. 3. The printed circuit board 13 is adhered onto the carrier 12, and then the glass plate is mounted onto the carrier 12 so as to complete the manufacture of the image sensing chip. The detailed manufacture process of the image sensing chip will be elaborated in later sections.

It is worth to notice that the choice of material for making the carrier 12 according to the present invention, in which plastic carrier substitutes the traditional ceramic carrier, since plastic has a cost far lower than that of the ceramic. Though plastic leaded chip carrier (PLCC) process is commonly used in packaging different chips, yet the hardness and physical properties of the image sensing chip 10 that will be easily affected by the high temperature and high pressure of the manufacture process and the environmental factors such as humidity or tiny particles of the packaging process cannot stand such impact, therefore there is still no process for the mass production of the image sensing chips. The inventor makes use of the materials with appropriate physical and chemical properties of high temperature resistance (e.g. High TG point ranging from 150° C. to 300° C.), low humidity (e.g. 23° C., 24-hour relative humidity 0.05 to 0.3) and high density.

Firstly, as shown in FIG. 3, the present invention has to achieve the automation for the manufacturing process of the image sensing chip 10, as shown in FIG. 1. Trays similar to tray 20, as shown in FIG. 2 are used. Such tray 20 has a plurality of accommodating grooves 21, and each accommodation groove 21 penetrates the tray 20, and the surface area of the upper opening is approximately equal to that of the image sensing chip 10 and the surface area of the lower opening is slightly smaller than that of the upper opening, so that each of the same type of components (glass board 11, carrier 12, and printed circuit board 13) are accommodated into individual trays for processing. Hereafter, the description of the specification will use the following terms "main tray", "first tray" and "second tray" without numbering to indicate trays similar to the tray 20. Please take the present invention for example, a plurality of printed circuit boards 13 are placed into a main tray (because it is unnecessary to remove the print circuit board 13 during the entire manufacturing process), a plurality of carriers 12 into a first tray, and a plurality of glass plates 11 into a second tray. In addition, to attain the automation for the process, the tray 20 also has a chip adhering mark 22 being disposed on a lateral side of the chip, and a conductive wire adhering mark being disposed on the corresponding side. Therefore, the tray 20 can be fixed in position by means of the chip adhering mark 22 and the conductive wire adhering mark 23 in the chip adhering step and the conductive wire adhering process. The entire manufacturing process can be accomplished by using the same tray 20. Of course, the tray 20 is not limited to the use for the PLCC packaging process, but it can be applied to the CLCC manufacturing process or other packaging process.

Figure 4:
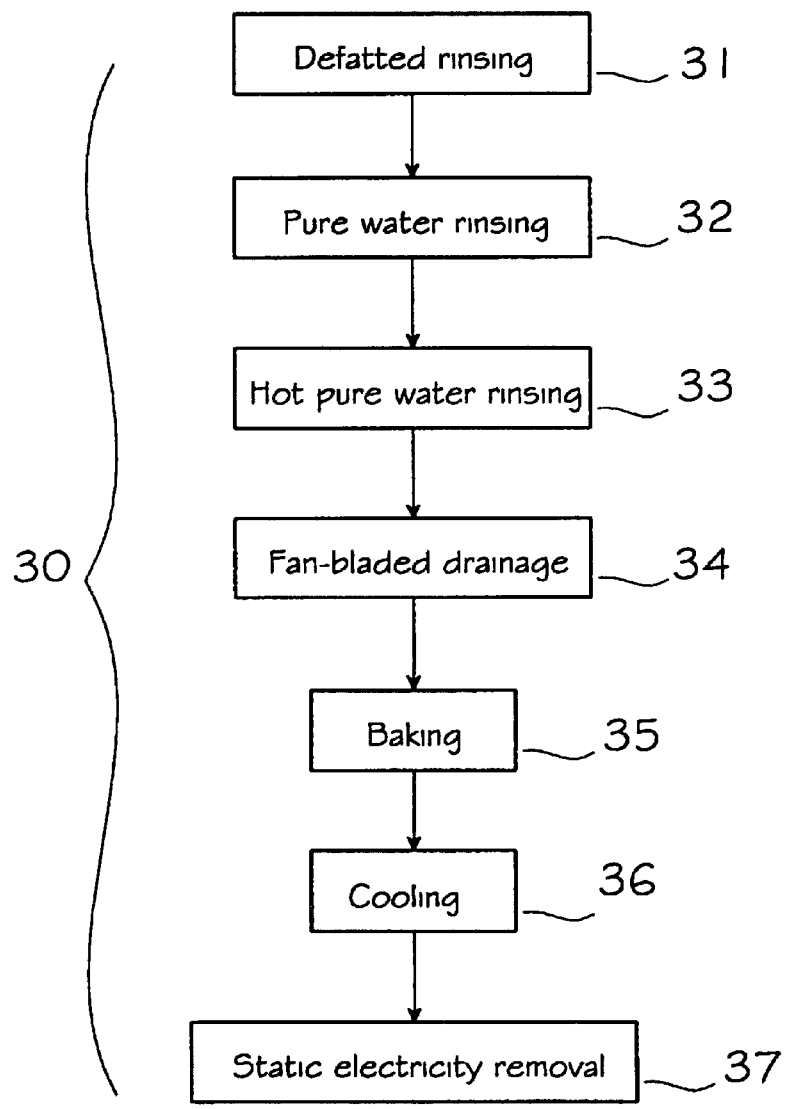
FIG. 4 is a block diagram showing the rinsing process according to the present invention.

Furthermore, to prevent the increase in defective rate of the product due to the environmental factors such as humidity and tiny particles during the manufacture process, the present invention provides a rinsing process 30 as shown in FIG. 4. Proceed with the rinsing process 30 to remove any factors including static electricity, humidity, and tiny particles that may affect the defective rate of the product before attaching each component. Since the printed circuit board 13, the carrier 12, and the glass plate 11 are placed in the main tray, the first tray, and the second tray separately, therefore the rinsing process 30 can be proceeded individually and will affect the efficiency of the entire process. Please refer to FIG. 4, it shows that the rinsing process 30 comprises the following steps: defatted rinsing 31, pure water rinsing 32, hot pure water rinsing 33, fan-bladed drainage 34, baking 35, cooling 36, and static electricity removal 37. The defatted rinsing 31 mainly is used for removing the organic matter and impurities adhered on the components, and the tray is put into a neutral rinsing solution and uses high-frequency supersonic vibration to dissolve and remove the organic matter and impurities. The chosen brand of SWAJ could be used for the neutral rinsing solution. To have a thorough rinsing, we can perform the defatted rinsing twice consecutively. The pure water rinsing 32 and hot pure water rinsing 33 are mainly for removing the inorganic substances and other impurities attached on the components. The tray is put in a container with deionizing solution. The required treatment level for defatted rinsing 31, pure water rinsing 32, and hot pure water rinsing is Class 1000. The fan-bladed drainage 34 and baking 35 are mainly for removing the moisture on the components, since the moisture generally causes imperfect mounting in the packaging process of the image sensing chip 10 and results in a high defective rate. Therefore, high-speed wind is used to blow away the moisture attached on the component and then vaporize the water moisture by high temperature (60° C. to 100° C.). Then, after the steps of cooling 36 and static electricity removal 37, each component can be sent to the manufacturing procedure for production. The required treatment level for the fan-bladed drainage 34, baking 35, cooling 36, and static electricity removal 37 is Class 100. Of course, the rinsing process 30 is not limited to the use for the PLCC chip packaging process, but it can also be applied in the CLCC chip packaging process or other packaging process.

Figure 5:
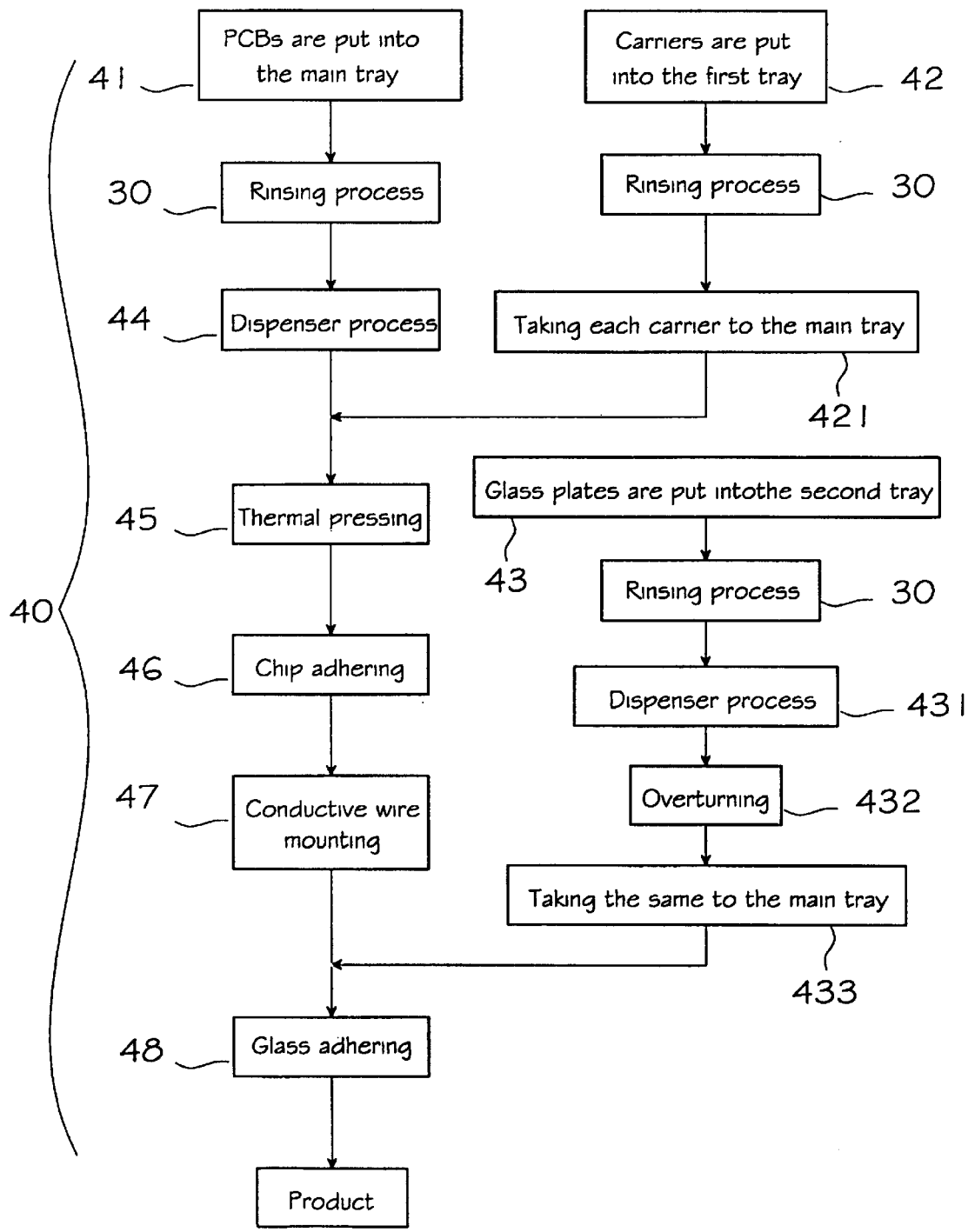
FIG. 5 is a block diagram showing the manufacturing flowchart of the image sensing chip according to the present invention.

FIG. 5 shows the block diagram of the manufacturing procedure of the image sensing chip 10. The printed circuit board 13, the carrier 12, and the glass plate 11 are put into the main tray, the first tray, and the second tray as in Steps 41, 42, and 43 respectively to proceed with the packaging process for the image sensing chip. To further elaborate the implementation of the embodiment of the present invention, please refer to FIG. 5 again, after putting the printed circuit board 13 into the main tray first, we perform the foregoing rinsing process 30, and then perform the dispenser process 44 on the printed circuit board 13. The dispensing method could be gluing, silkscreen, or other method. After putting the carrier 12 into the first tray, we proceed with the foregoing rinsing process 30, and then performing the step 421 to take each carrier 12 to the main tray either manually or by vacuum. After each carrier 12 is placed and fixed in the corresponding printed circuit boards 13 on the tray, proceed with the thermal pressing step 45, chip adhering step 46, and conductive wire mounting step 47; wherein the temperature and pressure for the pressing step 45 is in the range from 60° C. to 200° C. and from 2 Kg/cm$^2$ to 8 Kg/cm$^2$ respectively, and the time for the thermal pressing is from 0.5 to 500 minutes. The chip adhering step 46 may use silver adhesive as the adhering material and the conductive wire adhering may use gold wire, aluminum wire, or copper wire as the adhering material. It is worth to notice that low temperature cooling (−40° C. by means of carbon dioxide), nitrogen gas blowing, and baking for removing moisture and impurities can be performed upon the semi-finished goods during chip adhering step 46. Since the tray 20 can carry 30 to 50 pieces of carriers and printed circuit boards at a time, therefore the manufacturing process of the present invention can finish 30 to 50 pieces of image sensing chip 10 at a time, and hence increases the manufacture efficiency drastically. Please continue to refer to FIG. 5 for the manufacturing process of the present invention. After the glass plate 11 put into the second tray, we proceed with the foregoing rinsing process 30. Since there will be no organic matter attached on the glass plate 11, therefore we can skip the defatted rinsing 31 step and just include the steps of pure water rinsing 32, hot pure water rinsing 33, fan-bladed drainage 34, baking 35, cooling 36, and static electricity removal 37. Then proceed with the dispenser process 431 on the glass plate 11, and the dispenser method could be gluing, silkscreen, or other method. Then we proceed with the overturning step 432 for each glass plate 11, so that the surface with the dispenser faces downward, and we can go ahead with the step 433 by taking it to the main tray either manually or by vacuum. Since the dispenser faces down, therefore the glass plate 11 can be directly aligned to the main tray for the glass adhering step 48.

Figure 6:
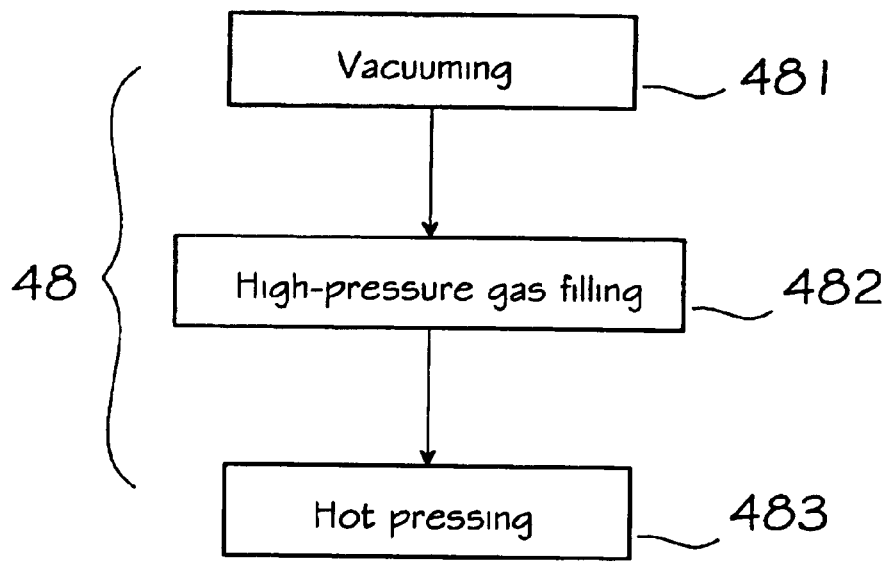
FIG. 6 is a block diagram showing the adhesion process of the glass plate according to the present invention.

Please refer to FIG. 6 for the explanation on the block diagram of the adhering step 48 of the glass plate. Such adhering step 48 is performed on a sealed machine for the manufacture, and comprises vacuuming step 481, high-pressure gas filling step 482, and hot pressing step 483. The vacuuming step 481 is to remove the moisture and impurities in the environment, and the high-pressure gas filling step 482 is to fill the chemically stable gas (such as nitrogen or helium) inside the machine. The pressure of the high-pressure gas ranges from 8 Kg/cm$^2$ to 12 Kg/cm$^2$. And then finally complete the manufacturing by adhering the glass plate 11 to the carrier 12. The temperature and pressure for the hot pressing step 483 ranges from 60° C. to 200° C. and from 2 Kg/cm$^2$ to 8 Kg/cm$^2$ respectively, and the time for the thermal pressing is from 0.5 to 500 minutes. The chemically stable high-pressure gas will be sealed into the image sensing chip 10 at the same time, therefore when operating an image sensing device with the image sensing chip 10 inside, the external moisture or impurities cannot enter into the chip easily because the internal pressure inside the image sensing chip 10 is larger than the external pressure, and hence extend the lifespan of the image sensing chip 10.

While the invention has been described with reference to various illustrative embodiments, the description is not intended to be construed in a limiting sense. Various modifications of the illustrative embodiments, as well as other embodiments of the invention, will be apparent to those skilled in the art upon reference to this description. It is therefore contemplated that the appended claims will cover any such modifications or embodiments as may fall within the scope of the invention defined by the following claims and their equivalents.

What is claimed is:

1. A packaging process for an image sensing component of which comprising a printed circuit board, a carrier, and a glass plate; wherein a plurality of said printed circuit board, carriers, and glass plates being placed in a main tray, a first tray, and a second tray respectively for the packaging process, comprising the steps of:

performing a rinsing process on the printed circuit board, carrier, and glass plate in the main tray, the first tray, and the second tray respectively as a pre-treatment;

dispensing the printed circuit board, and then capturing the carriers in the first tray onto each of the printed circuit board of the main tray;

performing a thermal pressing process and an adhering process on the printed circuit board and the carrier;

dispensing the glass plate, and then collecting the carrier in the first tray to each printed circuit board of the main tray; and adhering the glass plate onto the carrier by thermal pressing in the high-pressure working environment.

2. A packaging process for an image sensing component as claimed in claim 1, wherein said pre-treatment of the rinsing process further comprising the steps of:

performing a defatted rinsing, which rinses the component in a neutral rinsing solution to remove organic substance and impurities by means of supersonic vibration;

performing a pure water rinsing, which rinses the component in a deionized pure water to remove organic substance and impurities by means of supersonic vibration; and baking the component to remove moisture.

3. A packaging process for an image sensing component as claimed in claim 1, wherein said pre-treatment of the rinsing process for the glass plate comprising the steps of:

performing a pure water rinsing, which rinses the component in a deionized pure water to remove organic substance and impurities by means of supersonic vibration; and baking the component to remove moisture.

4. A packaging process for an image sensing component as claimed in claim 1, wherein said carrier being made of plastic material with the properties of high density, high temperature resistance, and low humidity.

5. A packaging process for an image sensing component as claimed in claim 1, wherein said high-pressure gas being one selected from nitrogen and helium, and its pressure ranging from 8 Kg/cm$^2$ to 12 Kg/cm$^2$.

6. A packaging process for an image sensing component as claimed in claim 1, wherein said adhering process for the printed circuit board and the carrier further comprising a chip adhering process and a conductive wire mounting.

7. A packaging process for an image sensing component as claimed in claim 1, wherein said dispenser being one selected from gluing and silkscreen.

8. A packaging process for an image sensing component as claimed in claim 6, wherein said chip adhering process further comprising the process of low-temperature cooling, nitrogen blowing, and baking.

* * * * *